(12) United States Patent
Lanzone et al.

(10) Patent No.: US 6,295,210 B1
(45) Date of Patent: Sep. 25, 2001

(54) CHASSIS GROUNDING RING FOR A PRINTED WIRING BOARD MOUNTING APERTURE

(75) Inventors: Chris Allan Lanzone; Richard A. Pierson, both of Rockwall; Andrea T. Sandage, Mesquite, all of TX (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/544,748

(22) Filed: Apr. 7, 2000

(51) Int. Cl.[7] ....................................... H05K 9/00
(52) U.S. Cl. .................. 361/799; 361/753; 361/759; 361/801; 174/51; 174/263
(58) Field of Search ................................. 361/752, 753, 361/758, 796, 797, 799, 801, 894; 174/51, 138 G, 263; 228/165

(56) References Cited

U.S. PATENT DOCUMENTS

| 4,851,614 | * | 7/1989 | Duncan, Jr. | 174/51 |
| 5,326,937 | * | 7/1994 | Watanabe | 174/263 |
| 5,420,378 | * | 5/1995 | Estes et al. | 174/263 |
| 5,668,699 | * | 9/1997 | Bell et al. | 361/753 |

FOREIGN PATENT DOCUMENTS

| 6-283871 | * | 6/1994 | (JP) . |
| 7-45973 | * | 7/1995 | (JP) . |

\* cited by examiner

*Primary Examiner*—Jayprakash N. Gandhi
(74) *Attorney, Agent, or Firm*—Locke Liddell & Sapp

(57) ABSTRACT

A printed wiring board is adapted to be mounted to a chassis using a fastener. The chassis provides an electrical ground for the printed wiring board. The board includes first and second sides and a mounting aperture extending therethrough for receiving the fastener. A plurality of spaced apart solder pads are disposed on one side of the board and adjacent to the mounting aperture. The pads are adapted to provide an electrical connection to the chassis. At lease one aperture is disposed in each of the plurality of pads. The aperture is plated creating an electrical connection between the sides of the board.

14 Claims, 5 Drawing Sheets

CHASSIS GROUNDING RING FOR A PRINTED WIRING BOARD MOUNTING APERTURE

TECHNICAL FIELD OF THE INVENTION

The present invention relates to printed wiring board assemblies, and more particularly to a chassis grounding ring for preventing plating over of printed wiring board mounted holes during wave soldering.

BACKGROUND OF THE INVENTION

A printed wiring board (PWB) may be electrically grounded to a chassis using a standoff that is in physical contact with the chassis and the PWB. The standoff is mechanically attached to the PWB utilizing a fastener which passes through an aperture contained on the PWB. This aperture may be a plated hole for creating an electrical connection between both sides of the PWB and the standoff.

To prevent solder from filling the plated hole, tape may be applied to the grounding hole. After the PWB is wave soldered, the tape is removed to expose the hole. The taping process is both time consuming and costly.

A need has thus arisen for a printed wiring board assembly that eliminates the need for taping of chassis ground holes and creates a higher quality and more consistent ground area.

SUMMARY OF THE INVENTION

In accordance with the present invention, a printed wiring board is adapted to be mounted to a chassis using a fastener. The chassis provides an electrical ground for the printed wiring board. The board includes first and second sides and a mounting aperture extending therethrough for receiving the fastener. A plurality of spaced apart solder pads or lands are disposed on one side of the board and adjacent to the mounting aperture. The pads are adapted to provide an electrical connection to the chassis. At lease one aperture is disposed in each of the plurality of pads. The aperture is plated creating an electrical connection between the sides of the board.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DETAILED DESCRIPTION

Figure 1A:
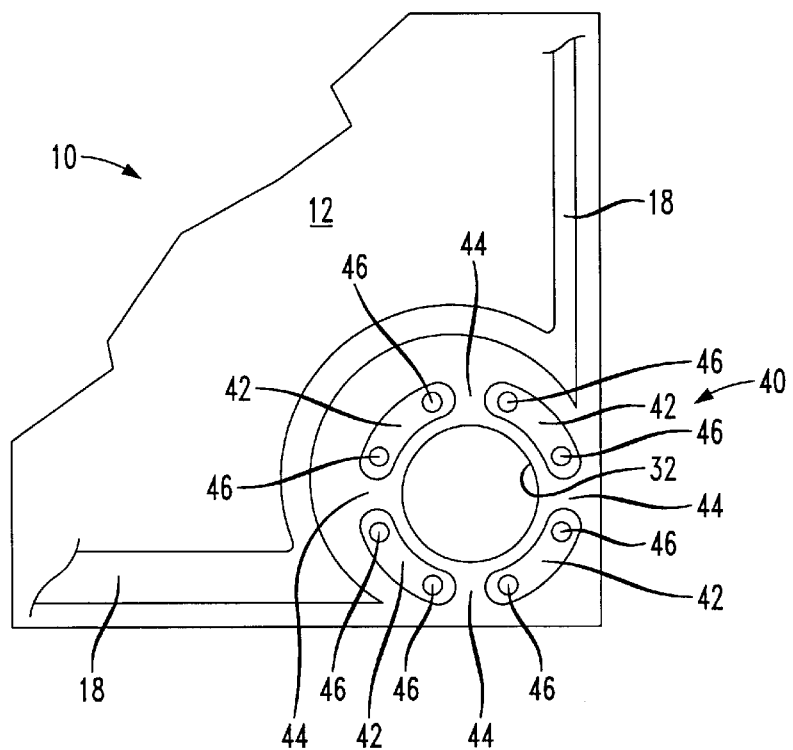
FIG. 1a is a plan view of a portion of one side of a printed wiring board illustrating an embodiment of the present invention.
Figure 1B:
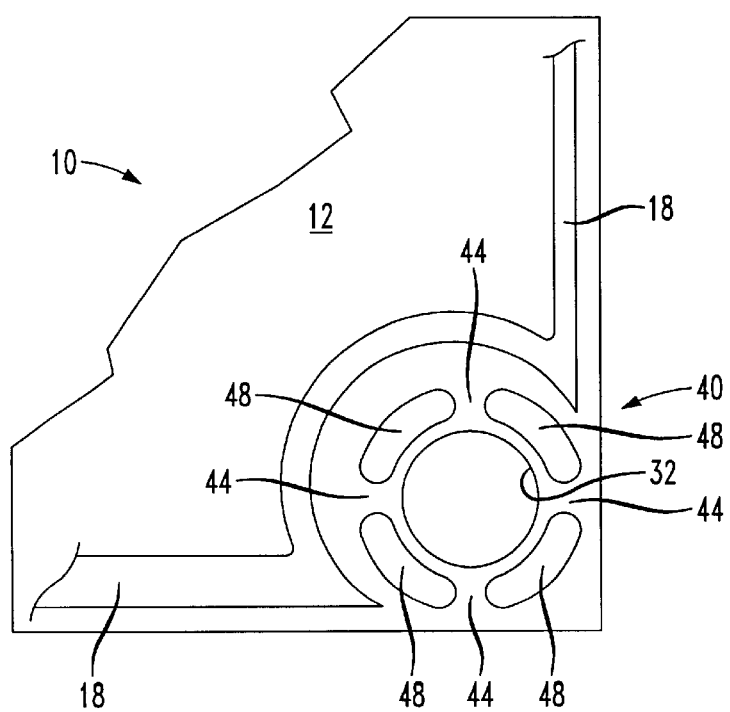
FIG. 1b is a plan view of the printed wiring board of FIG. 1 after wave soldering.
Figure 2:
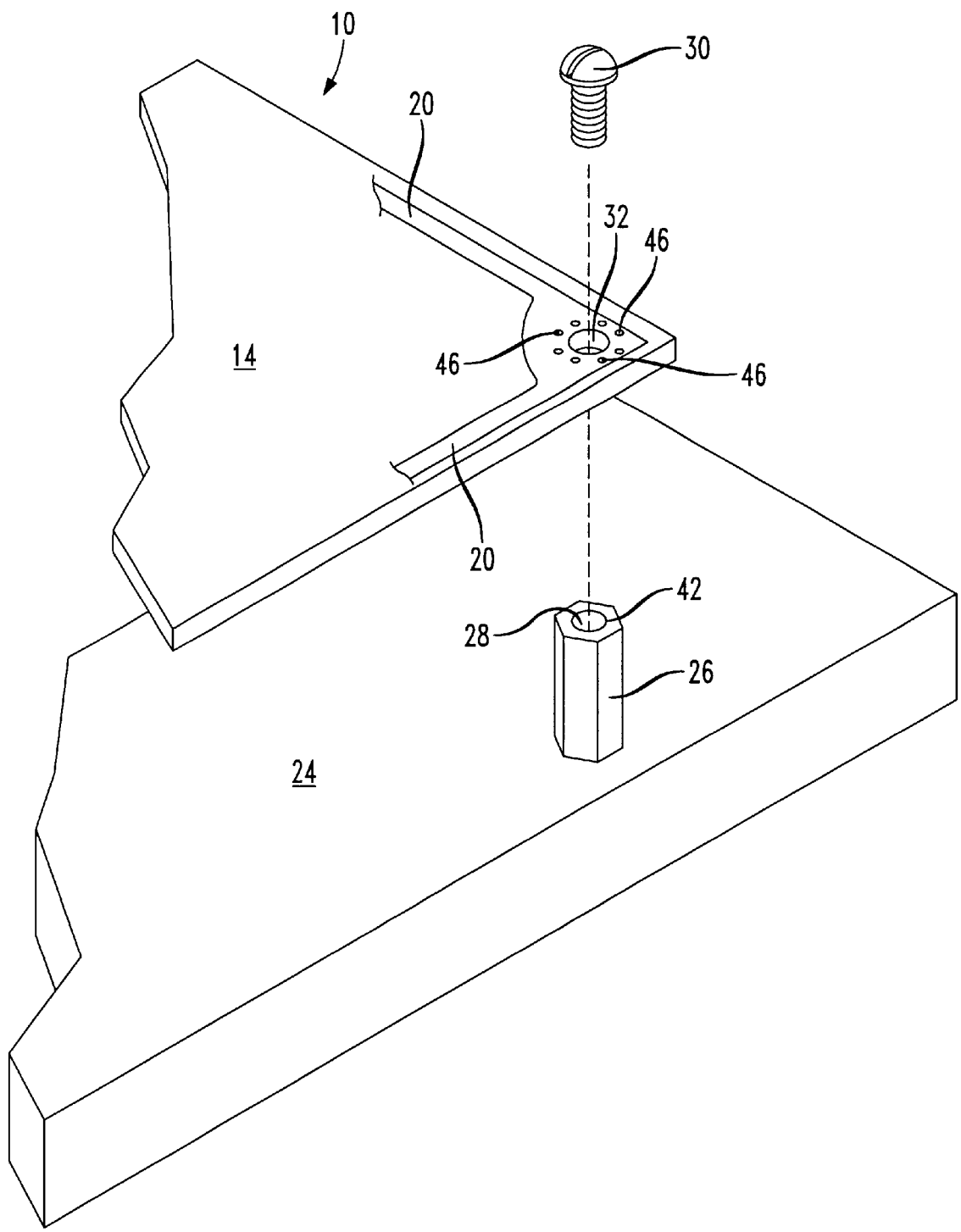
FIG. 2 is an exploded perspective view of the present printed wiring board mounted to a chassis.

Referring simultaneously to FIGS. 1a, 1b, and 2, the present printed wiring board (PWB) is illustrated, and is generally identified by the numeral 10. Printed wiring board 10 includes a first side 12 and a second side 14. Side 12 of PWB 10 includes circuit traces such as, for example, trace 18. Side 14 includes circuit trace 20 which provides an electrical ground for printed wiring board 10.

PWB 10 is mounted to a chassis 24 using a standoff 26. Standoff 26 includes a threaded aperture 28 for receiving a fastener 30 which passes through an aperture 32 within PWB 10. Aperture 32 passes through PWB 10 and is a non-plated hole.

In accordance with the present invention, side 12 of PWB 10 includes a grounding ring, generally identified by the numeral 40. Grounding ring 40 contacts surface 42 of standoff 26 to create an electrical connection between PWB 10 and chassis 24. As illustrated in the embodiment of FIGS. 1a and 1b, grounding ring 40 includes four spaced apart lands or solder pads 42 which are circularly disposed around aperture 32. Disposed between pads 42 are gaps 44. Contained within each solder pad 42 is a pair of plated through holes or vias 46. Vias 46 provide an electrical contact between ring 44 and trace 20 of side 14 of PWB 10.

FIG. 1b illustrates side 12 of PWB 10 after wave soldering at which time pads 42 are covered with solder 48 which flows into vias 46. An electrical connection is thereby made between chassis 24 and PWB 10 through standoff 26, grounding ring 40, and through vias 46 to trace 20 of side 14 of PWB 10. Grounding ring 40 including gaps 44 breaks the surface tension of the solder during wave soldering which prevents solder from plating over aperture 32 on side 12 of PWB 10. As a result, no taping of aperture 32 is required.

Figure 3A:
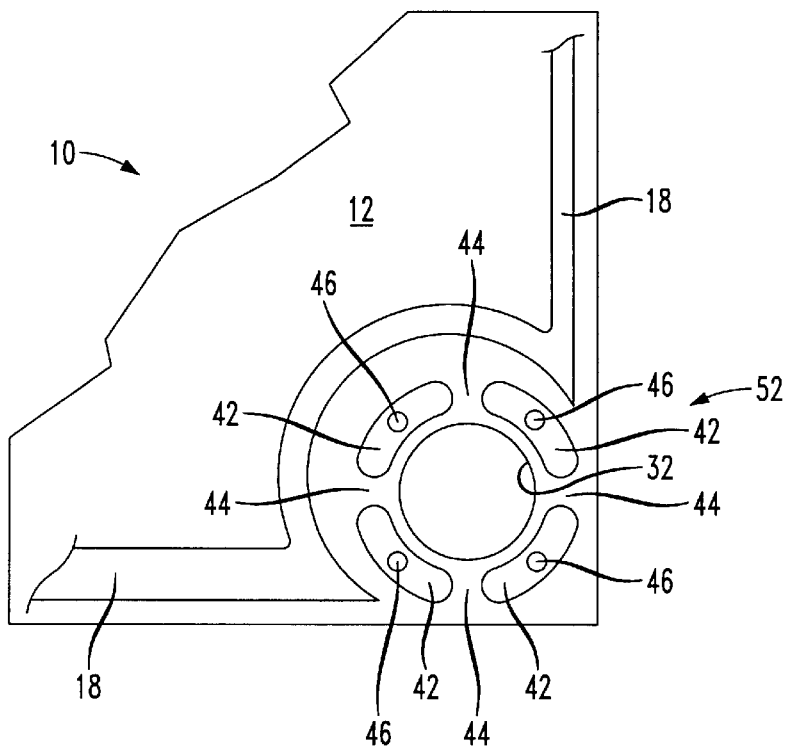
FIG. 3a is a plan view of a portion of one side of a printed wiring board illustrating an additional embodiment of the present invention.
Figure 3B:
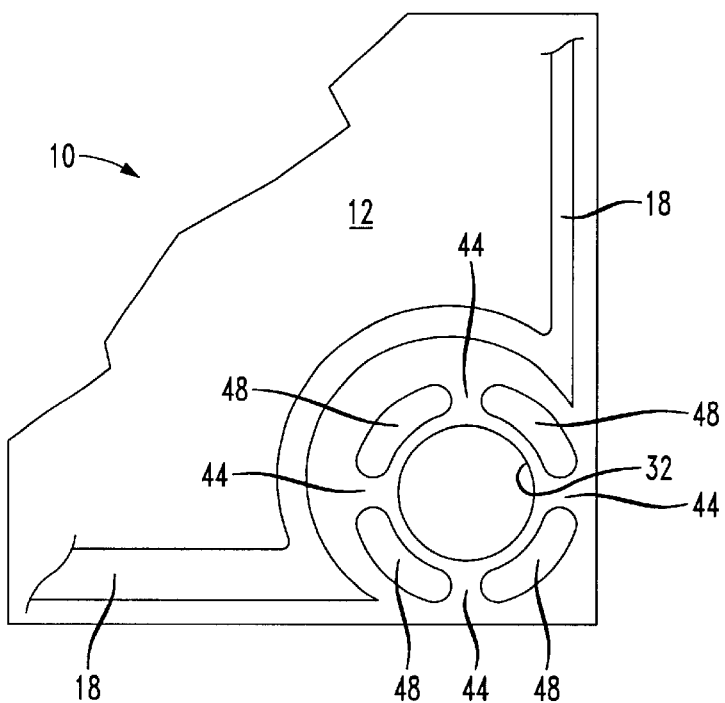
FIG. 3b is a plan view of the printed wiring board of FIG. 3a after wave soldering.

Referring now to FIGS. 3a and 3b, an additional embodiment of the present invention is illustrated, wherein like numerals are utilized for like and corresponding components. FIGS. 3a and 3b illustrate a grounding ring, generally identified by the numeral 52 in which each solder pad 42 contains a single via 46. Grounding ring 52 functions in a manner similar to grounding ring 40, FIGS. 1a, 1b, and 2.

Figure 4A:
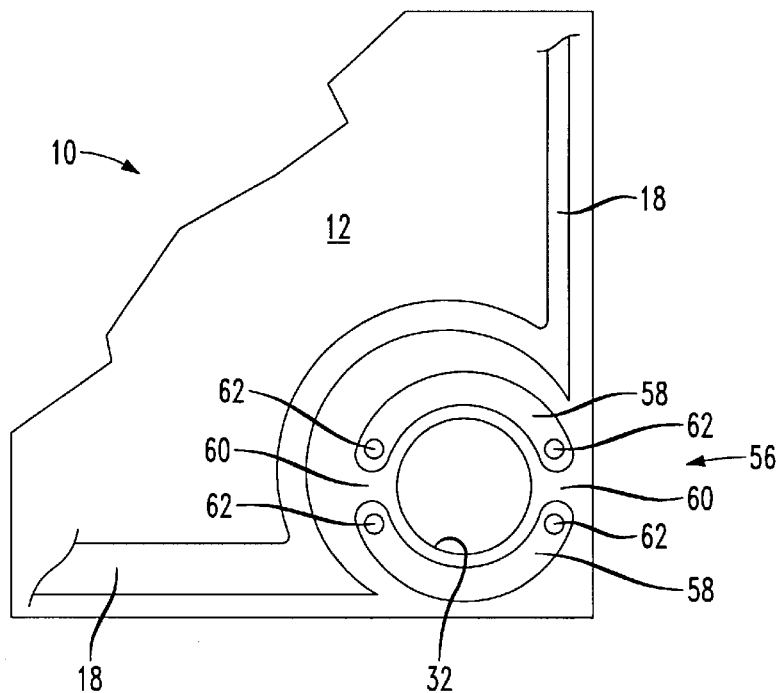
FIG. 4a is a plan view of a portion of one side of a printed wiring board illustrating an additional embodiment of the present invention.
Figure 4B:
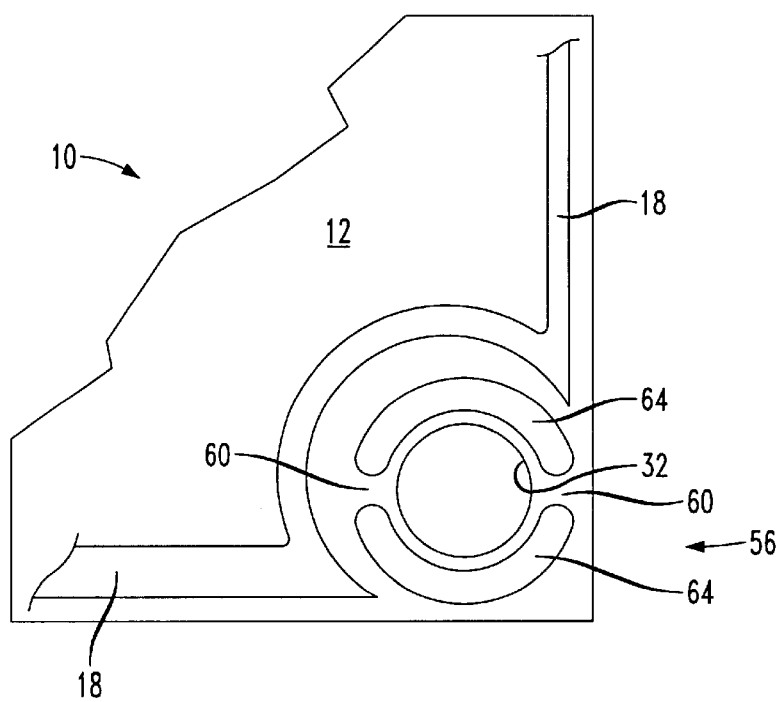
FIG. 4b is a plan view of the printed wiring board of FIG. 4a after wave soldering.

Referring now to FIGS. 4a and 4b, an additional embodiment of the present invention is illustrated wherein like numerals are utilized for like and corresponding components previously identified. FIGS. 4a and 4b illustrate a grounding ring, generally identified by the numeral 56 composed of two lands or solder pads 58 spaced apart by gaps 60. Each pad 58 contains two vias 62. FIG. 4b illustrates PWB 10 after wave solder, at which time pads 58 are plated over by solder 64. Grounding ring 56 may include more than two vias 62 for each pad 58.

Figure 5A:
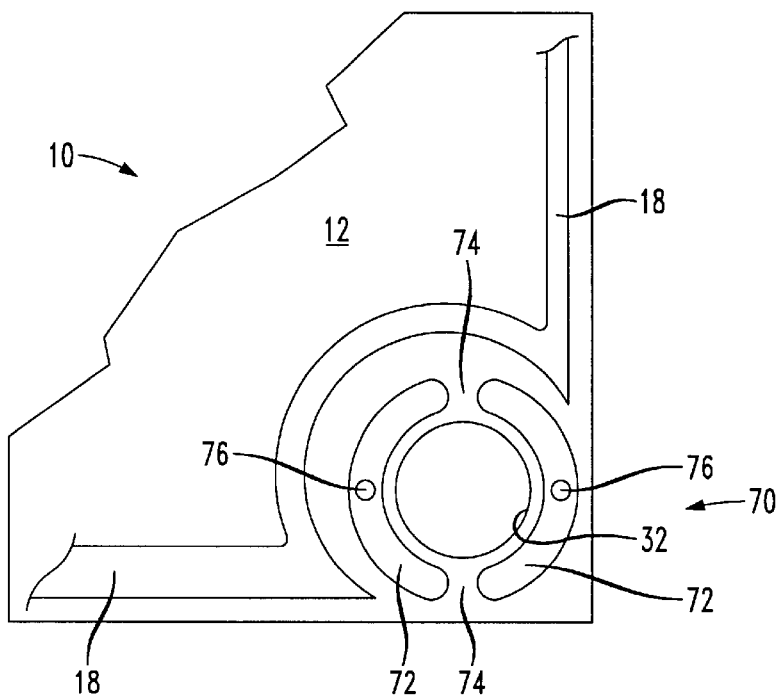
FIG. 5a is a plan view of a portion of one side of a printed wiring board illustrating an additional embodiment of the present invention.
Figure 5B:
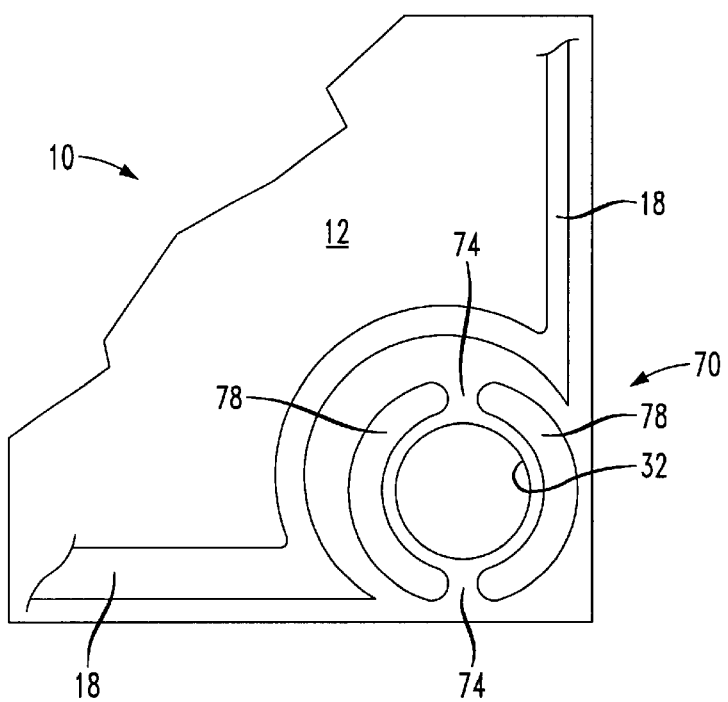
FIG. 5b is a plan view of the printed wiring board of FIG. 5a after wave soldering.

Referring now to FIGS. 5a and 5b, an additional embodiment of the present invention is illustrated wherein like numerals are utilized for like and corresponding components previously identified. FIGS. 5a and 5b illustrate a grounding ring, generally identified by the numeral 70 having two lands or pads 72 spaced apart by gaps 74. Each pad 72 includes a single via 76; however, multiple vias 76 can be utilized for each pad 72. As illustrated in FIG. 5b, after wave solder, each pad 72 is plated over with solder 78.

Grounding rings 56 and 70 function in a manner similar to that of grounding ring 40 to provide contact between surface 42 of standoff 26 and PWB 10 thereby creating an electrical connection between side 14 of PWB 10 and chassis 24.

It therefore can be seen that the present invention provides for a grounding ring for a printed wiring board that eliminates the need for additional processes of taping of grounding holes and which creates a high quality and consistent ground area for providing electrical ground connection between a PWB and a chassis.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. A printed wiring board adapted to be mounted to a chassis using a fastener, the chassis providing an electrical ground for the board, the board including;
    a printed wiring board having first and second sides, and including a mounting aperture extending therethrough for receiving the fastener; and
    a plurality of spaced apart solder pads disposed on one side of said board and adjacent to said mounting aperture, said plurality of spaced apart solder pads being spaced apart by a plurality of gaps to which solder does not adhere, said gaps breaking surface tension of a solder wave to prevent solder from plating over said mounting aperture during soldering of the printed wiring board, and said plurality of solder pads adapted to create an electrical connection to the chassis.

2. The printed wiring board of claim 1 and further including;
    a least one aperture disposed in each of said plurality of solder pads; and
    said at least one aperture being plated for creating an electrical connection between said sides of said printed wiring board.

3. The printed wiring board of claim 1 and further including:
    a pair of apertures disposed in each of said plurality of pads; and
    said pair of apertures being plated for providing an electrical connection between said sides of said printed wiring board.

4. A printed wiring board adapted to be mounted to a chassis using a fastener, the chassis providing an electrical ground for the board, the board including;
    a printed wiring board having first and second sides, and including a mounting aperture extending therethrough for receiving the fastener; and
    two spaced apart solder pads disposed on one side of said board and adjacent to said mounting aperture, said two spaced apart solder pads being spaced apart by two gaps to which solder does not adhere, said gaps disposed about 180° from each other around said aperture and breaking surface tension of a solder wave to prevent solder from plating over said mounting aperture during soldering of the printed wiring board, and said solder pads adapted to create an electrical connection to the chassis.

5. The printed wiring board of claim 4 and further including;
    a least one aperture disposed in each of said solder pads; and
    said at least one aperture being plated for creating an electrical connection between said sides of said printed wiring board.

6. The printed wiring board of claim 4 and further including:
    a pair of apertures disposed in each of said pads; and
    said pair of apertures being plated for creating an electrical connection between said sides of said printed wiring board.

7. A printed wiring board adapted to be mounted to a chassis using a fastener, the chassis providing an electrical ground for the board, the board including;
    a printed wiring board having first and second sides, and including a mounting aperture extending therethrough for receiving the fastener; and
    four spaced apart solder pads disposed on one side of said board and adjacent to said mounting aperture, said four spaced apart solder pads being spaced apart by four gaps to which solder does not adhere, said gaps disposed about 90° from each other around said aperture and breaking surface tension of a solder wave to prevent solder from plating over said mounting aperture during soldering of the printed wiring board, and said solder pads adapted to create an electrical connection to the chassis.

8. The printed wiring board of claim 7 and further including;
    a least one aperture disposed in each of said solder pads; and
    said at least one aperture being plated for creating an electrical connection between said sides of said printed wiring board.

9. The printed wiring board of claim 7 and further including:
    a pair of apertures disposed in each of said pads; and
    said pair of apertures being plated for creating an electrical connection between said sides of said printed wiring board.

10. A printed wiring board assembly comprising:
    a chassis;
    a fastener;
    a printed wiring board having first and second sides, and including a mounting aperture extending therethrough for receiving said fastener for mounting said printed wiring board to said chassis;
    a plurality of spaced apart solder pads disposed on one side of said board and adjacent to said mounting aperture, said plurality of spaced apart solder pads being spaced apart by a plurality of gaps to which solder does not adhere, said gaps breaking surface tension of a solder wave to prevent solder from plating over said mounting aperture during soldering of the printed wiring board, and said plurality of solder pads adapted to create an electrical connection to the chassis;
    a least one aperture disposed in each of said plurality of solder pads; and said at least one aperture being plated for creating an electrical connection between said sides of said printed wiring board.

11. The assembly of claim 10 and further including:

a standoff mounted to said chassis and said printed wiring board, said standoff contacting said plurality of solder pads.

12. The assembly of claim 11 wherein said standoff includes an aperture for receiving said fastener.

13. The assembly of claim 10 wherein said plurality of solder pads comprise four solder pads, each having two apertures.

14. The assembly of claim 10 wherein said plurality of solder pads comprise two solder pads, each having two apertures.

* * * * *